United States Patent [19]
Widmer

[11] Patent Number: 5,699,062
[45] Date of Patent: Dec. 16, 1997

[54] TRANSMISSION CODE HAVING LOCAL PARITY

[75] Inventor: Albert X. Widmer, Katonah, N.Y.

[73] Assignee: International Business Machines Corporation, Armonk, N.Y.

[21] Appl. No.: 532,152

[22] Filed: Feb. 1, 1995

[51] Int. Cl.$^6$ ..................................................... H03M 5/00
[52] U.S. Cl. ........................ 341/58; 341/95; 341/94
[58] Field of Search .............................. 341/58, 59, 94, 341/95; 371/50.1; 375/265; 370/82, 83, 99

[56] References Cited

U.S. PATENT DOCUMENTS

| | | | |
|---|---|---|---|
| 4,365,332 | 12/1982 | Rice | 371/50.1 |
| 4,464,747 | 8/1984 | Groudan et al. | 371/50.1 |
| 4,486,739 | 12/1984 | Franaszek et al. | 341/95 |
| 4,573,034 | 2/1986 | Schouhamer Immink | 341/100 |
| 4,728,929 | 3/1988 | Tanaka | 341/95 |
| 5,025,256 | 6/1991 | Stevens | 341/59 |
| 5,144,304 | 9/1992 | McMahon et al. | 341/58 |
| 5,451,943 | 9/1995 | Satomura | 341/58 |

*Primary Examiner*—Marc S. Hoff
*Attorney, Agent, or Firm*—Daniel P. Morris

[57] ABSTRACT

A method and apparatus are described for coding a frame of N-bit bytes into a frame of coded M-bit bytes wherein M>N>0 and wherein said frame has a frame boundary including the steps of storing a frame of M-bit bytes; providing a code containing a set of M-bit bytes which is a subset of all possible M-bit bytes; for each of the $2^N$ possible N-bit bytes there is a corresponding member in the set; each of the members of the code has a sequence of bits having a binary state selected from one of three values such that if the state of one of the bits is changed, a resulting M-bit byte is not a member of the code; one of the members of the code is a comma used to identify the frame boundary; the comma has a sequence of bits having a binary state selected from a first and second value such that the bit sequence of the comma is confined to one of the members of the code and the bit sequence of the comma does not occur across a boundary between any combination of any other members of the code; assigning to each of said N-bit bytes in the frame the corresponding member from the code to form a coded frame corresponding to the frame; and storing the coded frame.

35 Claims, 3 Drawing Sheets

TRANSMISSION CODE HAVING LOCAL PARITY

FIELD OF THE INVENTION

The present invention is directed to an apparatus and method for generating coded data from uncoded data using a code having local parity and a unique and singular comma.

BACKGROUND OF THE INVENTION

The primary purpose of transmission codes is to transform the frequency spectrum of a serial data stream so that clocking can be recovered readily and AC coupling is possible. The code must also provide special characters outside the data alphabet for functions such as character synchronization, frame delimiters and perhaps for abort, reset, idle, diagnostics, etc. (;odes are also used, often in combination with signal waveform shaping, to adapt the signal spectrum more closely to specific channel requirements. In most cases, a reduction in bandwidth by constraints on both the high and the low frequency components is desirable to reduce distortion in the transmission media, especially electromagnetic cables, or in the hand limited receiver, and to reduce the effects of extrinsic and intrinsic noise.

Another aspect of codes is their interaction with noise and errors in the line digits. The redundancy associated with line codes can be used to supplement other error detection mechanisms or to monitor the quality of the channel with a minimal amount of circuitry.

Such codes generally exhibit the undesirable feature of enlarging error bin sis in the decoded data, making detection by a cyclic redundancy check more difficult. A good transmission code should minimize these effects.

For fiber optic links and intra-establishment wire links, interest centers for many reasons on the family of two-level codes. For wire links one prefers codes with no DC and little low frequency content in order to DC isolate the transmission line from the driver and receiver circuitry, usually by reactive components, and to reduce signal distortion on the line. Although these factors do not apply to the fiber optic case, good low frequency characteristics of the code are help fill for a number of reasons.

During discussion of coding issues for the ANSI Fibre Channel [Sachs, 1994] by a Task Group X3T9.3 of the Technical Committee [1992] on Device Level Interfaces, a significant minority felt that the physical link should provide Forward Error Correction (FEC). Four different reasons for these requests have been advanced:

- The effective error rate should be less than $10^{-15}$, perhaps as low as $10^{-17}$.
- Optical components with less stringent performance parameters are available at lower cost, and the performance degradation can be offset with FEC.
- For long links, it is required that the incidence of retransmission be reduced because of the long delays associated with retransmission.
- Real time applications may not be able to work with retransmission.

Some of the above issues have been discussed by Grover [1988] and other solutions using polynomial codes have been proposed.

The task force considered the outlines of a specific FEC proposal. A more detailed description is now available in the literature [Benz et al., 1991; McMahon et al, 1992; Springer, 1992]. The proposal included a table lookup 8B/10B code and an 8 bit shortened Hamming code applied to the coded bits for every 8 information bytes. The FEC bits are Manchester coded. One pair of such coded bits is inserted between the 8B/10B coded bytes. The data transfer rate is reduced from 0.8 to 0.667. A single error in 8 data bytes can always be corrected.

Other approaches to combine error correction with run-length and DC constrained binary codes are described by French [1989], Blaum [1991], Blaum et al. [1993], Coetzee et al. [1990], and others. These studies address the more complex codes for magnetic channels which generally require different constraints from those for fiber optic or metallic transmission channels.

Figure 1:
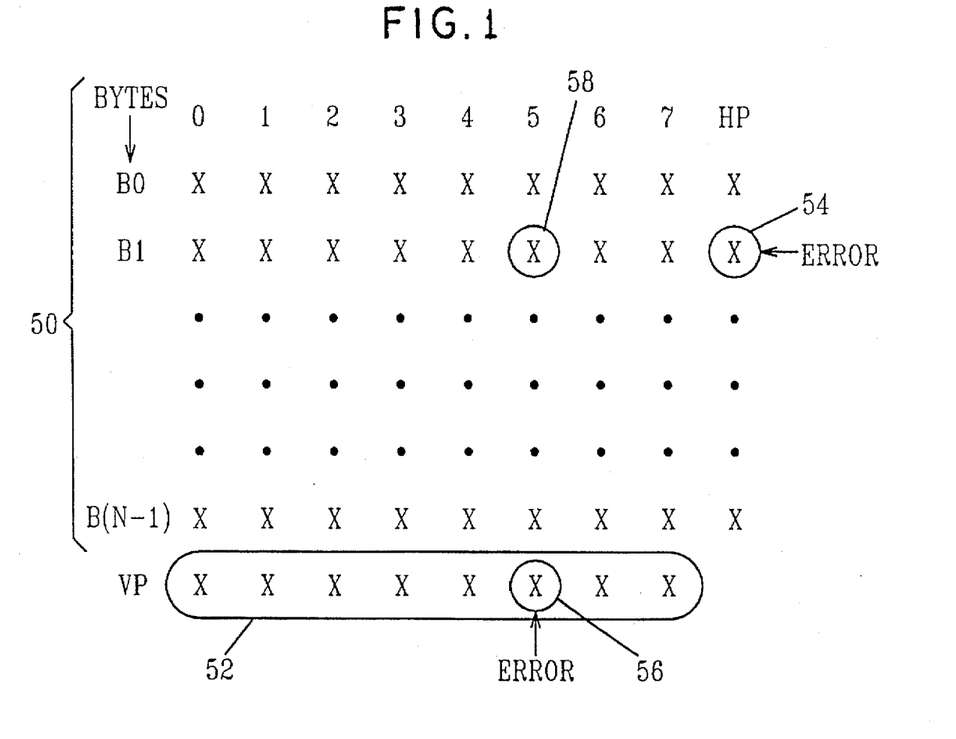
FIG. 1 schematically shows using classical horizontal and vertical parity to correct errors.

Referring to FIG. 1, a classical error correction technique uses a horizontal parity (HP) and a vertical parity (VP). Each "X" in FIG. 1 represents one bit of data. The numbers 0–7 in the raw data bits represent the eight locations of an eight bit byte. In the first column, under heading Bytes, B0 to B(N-1) represent the N bytes of a frame 50. For each bit location of the frame 50, there is a vertical parity bit corresponding to the vertical parity across each of the bytes in the frame. Eight vertical parity bits form vertical parity byte 52. For each of the bytes in frame 50, there is a horizontal parity. When data such as shown in FIG. 1 is transmitted, each byte and its associated horizontal parity are transmitted and the byte 52 corresponding to the vertical parities for each of the bit locations is transmitted with the frame. The receiving machine recomputes a horizontal parity for each transmitted byte and recomputes a vertical parity for the transmitted frame. The recomputed horizontal parity is compared to the transmitted horizontal parity, and the recomputed vertical parity is compared to the transmitted vertical parity. If there is a disagreement, for example, in the horizontal parity 54 for the transmitted byte B1 and, for example, vertical parity bit 56 for bit location 5 of the vertical parity, it is then known that bit 58, which is bit location 5 of byte B1, is in error and the value is changed to the other binary state; that is, if it is a 1, it is changed to a 0 or vice versa.

The raw binary data is generally not transmitted but is first converted into coded data having bytes with a larger number of bits than contained in the raw data bytes. Coding is used for a number of reasons as outlined above. A delimiter is needed to define word boundaries and frame boundaries. A delimiter is needed so that when data is transmitted, the receiver can determine where the frame of data which is being sent begins. A comma is a singular bit sequence which identifies the character or byte boundaries in a serial bit stream. It is desirable to have a code with a comma which is confined to a single character. A comma character is usually used to serve both as a delimiter and byte synchronizer. Also, when transmitting data, it is desirable to have run lengths of consecutive ones or of consecutive zeros which are small because long runs make the clock recovery from the received data stream difficult and expensive. Coded data is used to limit the run length to less than some predetermined value so the relative timing of data and receiver clock transitions can be compared at frequent intervals. Also, it is desirable to have coded data which is DC balanced. The digital sum variation must be finite and a low value. If there are a large number of ones or zeros consecutively, the charge levels on circuitry containing reactive components will increase, adversely affecting AC coupling because of DC and low frequency wander.

Since coded bytes have more bits than contained in the byte of raw data, it is undesirable to use classical horizontal and vertical parity with coded data since the horizontal parity for the coded data is likely to need more than one bit location in the coded byte. For a frame containing a large number of bytes, the horizontal parity would add a substantially large amount of additional bits, thereby resulting in a significant impact on the number of bit locations which are carrying useful information.

It is an object of the present invention to provide a code which inherently contains parity for each byte, so there is no need to have an explicit horizontal parity to locate erroneous bytes.

SUMMARY OF THE INVENTION

Broad aspects of the invention are a method and apparatus for coding a frame of N-bit bytes into a frame of coded M-bit bytes wherein M>N>0 and wherein said frame includes a comma for byte and frame demarcation, providing a code consisting of a set of M-bit bytes which is a subset of all possible M-bit bytes; for each of the $2^N$ possible N-bit bytes there is a corresponding member in said set; each of said member off said code is a sequence orbits such that if one of the bits is changed, a resulting M-bit byte is not one of said members of said code; one of the members of the code is a comma used to identify the byte and frame boundaries, the comma has a sequence of bits having a binary state selected from a first and second value such that the bit sequence of the comma is confined to one of said members of the code and the bit sequence of the comma does not occur across a boundary between any combination of any other members of the code; assigning to each of said N-bit bytes in said frame said corresponding member from said code to form a coded frame corresponding to said frame; and storing said coded frame.

A more specific aspect of the present invention is a method and apparatus for converting all 256 8-bit bytes to a set of coded 10-bit bytes wherein if an error accrues in a bit location of a particular coded byte, it generates an invalid coded byte, and wherein the set of coded bytes includes a comma which is confined to a single byte, and wherein the bit sequence of the comma is singular, that is the sequence of bits corresponding to the comma cannot be found in any byte sequence with another alignment relative to the byte boundaries, neither inside the bytes nor across the byte boundaries.

In a more particular aspect of the present invention, vertical parity is used to identify the bit location of the error within a byte known to be erroneous.

In a more particular aspect of the present invention, the code is limited to a run length less than 5 or equal to 5.

In another more particular aspect of the present invention, there are no run lengths of greater than 5 spanning a boundary between adjacent bytes.

In another more particular aspect of the present invention, there are no contiguous runs of length 5.

In another more particular aspect of the present invention, a bit pattern '11011111' and its complement '00100000' are a synchronizing sequence or comma embedded in a 10-bit comma character '0110111110' and its complement '1001000001', respectively. The comma contains 4 transitions within the comma and a sequence of comma characters generates 5 transitions per comma character.

In another more particular aspect of the code according to the present invention, the code contains 256 data characters, corresponding to the number of 8-bit data bytes, and 4 non-data characters.

In another more particular aspect of the present invention, the comma bit sequence and the complementary comma bit sequence do not accrue in any other coded byte or in spanning a boundary between adjacent valid coded bytes.

BRIEF DESCRIPTION OF THE FIGURES

Further objects, features, and advantages of the present invention will become apparent from a consideration of the following detailed description of the invention when read in conjunction with the drawing Figures, in which.

DETAILED DESCRIPTION

An invention described herein is directed to a method to correct a single erroneous byte in a frame. The fundamental principle is using a rectangular arrangement of horizontal and vertical parity bits, where the horizontal parity locates the erroneous byte and the vertical parity is used to correct it. The distinctive feature is that the functional equivalent of the horizontal parity is provided by a special 8B/10B transmission code with local parity.

In a code with local parity, each 8-bit byte has a unique coded 10-bit byte which corresponds thereto. The coded bytes are designed such that if there is an error in any one of the bit locations, the valid coded byte would be converted into an invalid coded byte. Described herein below is a code having local parity.

A set VPAR of 8 vertical parity bits is derived from the uncoded data, coded and packed into the first Idle word following the End of Frame. After identification era faulty byte at the receiver, the VPAR bits are used to correct it.

Initially, the elementary rectangular error correction scheme using parity bits is described. Then the use of horizontal parity to locate an error will be described. An improved version of an 8B/10B code with intrinsic local parity is presented. Then the correction of an erroneous byte by vertical parity bits is described as well as the restoration of faulty control characters.

Elementary Correction Scheme

The basic correction scheme proposed according to the present invention is based on ordering of data and parity bits, as shown in FIG. 1, in a rectangular or matrix arrangement. A frame is partitioned into small segments, preferably bytes or words. A parity or other means of error detection is attached to each of the segments, and together they form a matrix line. Successive segments are placed on the following lines. This first set of parity bits is called the horizontal parity. Several of these segments are followed by a vertical parity set as indicated in the matrix in FIG. 1. The vertical parity consists of a parity bit for each data bit column. It is used to identify and correct the erroneous bit or bits in the segment which was tagged as erroneous by the horizontal parity.

An entire faulty line can be corrected. For this reason, the vertical parity is computed on the uncoded bits, since error spread from decoding contained to a segment or byte does not interfere with correction. The vertical parity has enough bits to cover at least one segment. To correct longer error bursts, two or more vertical parity lines may be appended; by way of example, a first parity can be calculated from all the even numbered lines, and a second one from all the odd numbered lines. It is then possible to correct error bursts extending over a pair of adjacent lines, or two isolated shorter bursts, if one of them occurs in an even and the other in an odd numbered line. The vertical parity bits are coded like data. If an error occurs in a vertical parity byte, it is ignored and not used for correction of possible other errors.

A necessary assumption is that, apart from short error bursts, the link error events occur randomly at a low enough rate so most of the time there is just a single error event within a frame. If this assumption does not hold, the frame length must be reduced, or a vertical parity must be inserted into the frame at fixed intervals. Another assumption is that most errors are confined to a single matrix line. The systems and methods shown described herein can be adapted to handle errors crossing line boundaries at the cost of increased complexity. It is a further requirement to have correct recognition of the start and the end of the frame in the presence of errors. A cyclic redundancy check computed over the frame ultimately determines the validity of the corrected or uncorrected frame. Retransmission facilities are preferably still available for the case where error correction fails: failure of the horizontal parity to detect certain multiple errors, an error burst longer than the vertical parity, lost byte synchronization, multiple error bursts, false start and end of frame detection, truncated or missing frames. etc.

Horizontal Parity

In the commonly used parity matrix, the horizontal parity is an explicit bit for each matrix line.

In the example below, the horizontal parity is instead supplied by the transmission code all by itself. Transmission codes are subject to several constraints to enhance reliable low cost transmission. Additional constraints can be built into a code, so any odd number of errors in a byte or word generates an invalid word. Such a property of the code is referred to as 'local parity' [Martin, 1985]. For general applications, such codes are less desirable, because the added constraint makes it necessary to degrade some transmission parameters, and to accept a more complex and higher cost implementation. Other 8B/10B codes, including the Fibre Channel Standard (FCS) code, most times also indicate immediately an invalid byte when an error has occurred. However, a substantial ratio of errors generates only a disparity violation farther down the bit stream, away from the byte where the error has occurred, and so the byte which contains the error(s) cannot directly be identified. For the design of a binary, DC balanced code with local parity, the following options are available:

It is possible to design codes consisting exclusively of balanced words, so any odd number of errors within such a word manifests itself as an unbalance. As an example, it is possible to convert 16 bits into 20 bits, such that all 20 bit words are balanced. However, such a 16B/20B code is complex to implement. Also, a single false bit can generate an error burst of 16 in the decoding process, which requires a larger set of vertical parity bits. Even though the 20 bit words are always balanced, the low frequency behavior of the code is no better than the partitioned 8B/10B FCS code.

There exist low disparity 8B/10B codes with local parity, so an odd number of errors generates always an invalid code word. One such code was suggested by Martin [1985]. Codes of this type generally are more difficult to implement than the partitioned 8B/10B code [Widmer, 1983], and have stronger low frequency spectral components, so the time constants of high pass filters must be increased by over 40%.

The code published by Martin [1985] also lacks a suitable comma confined to one byte. A code with a good comma is described below.

Figure 2A:
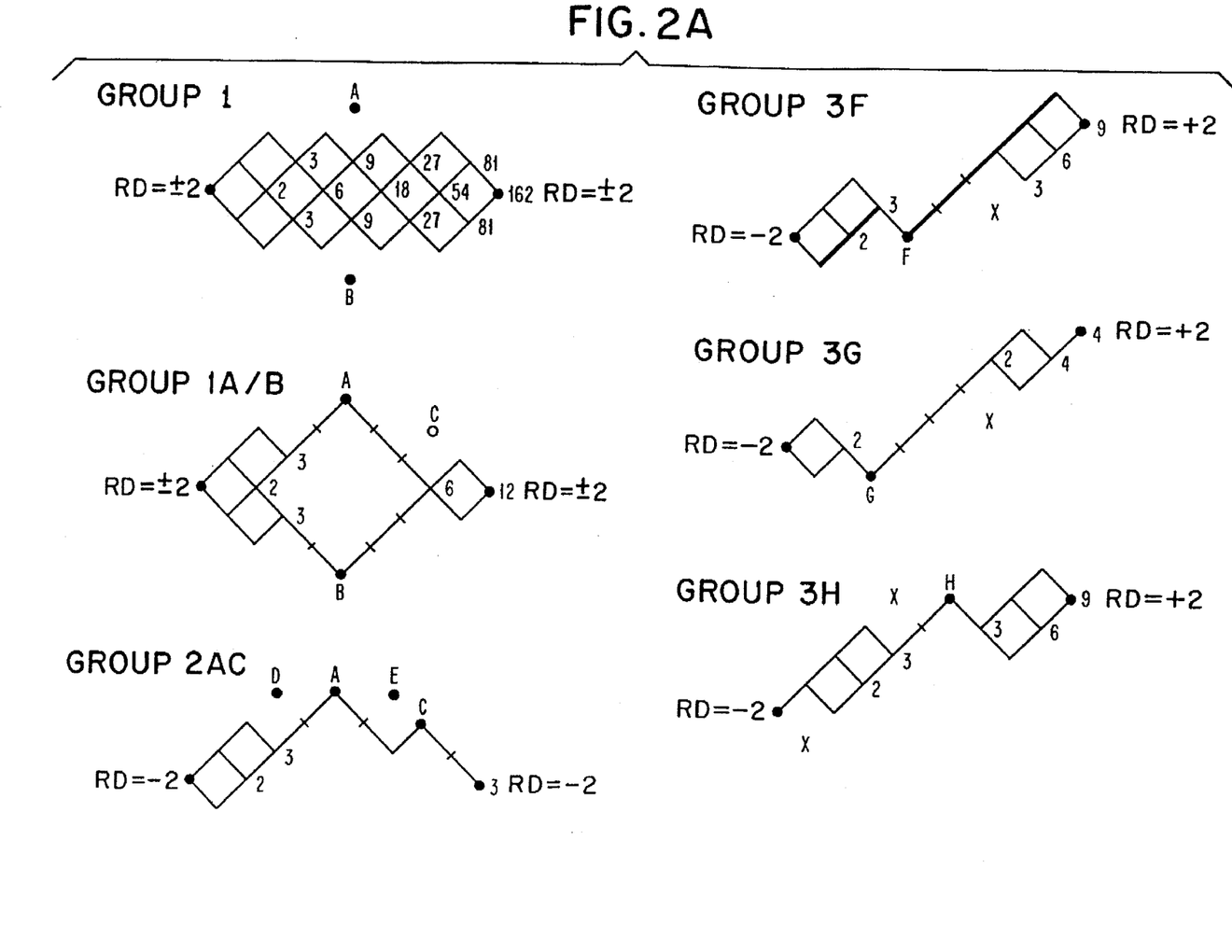
FIG. 2 shows an 8B/10B code with local parity and a short comma.
Figure 2B:
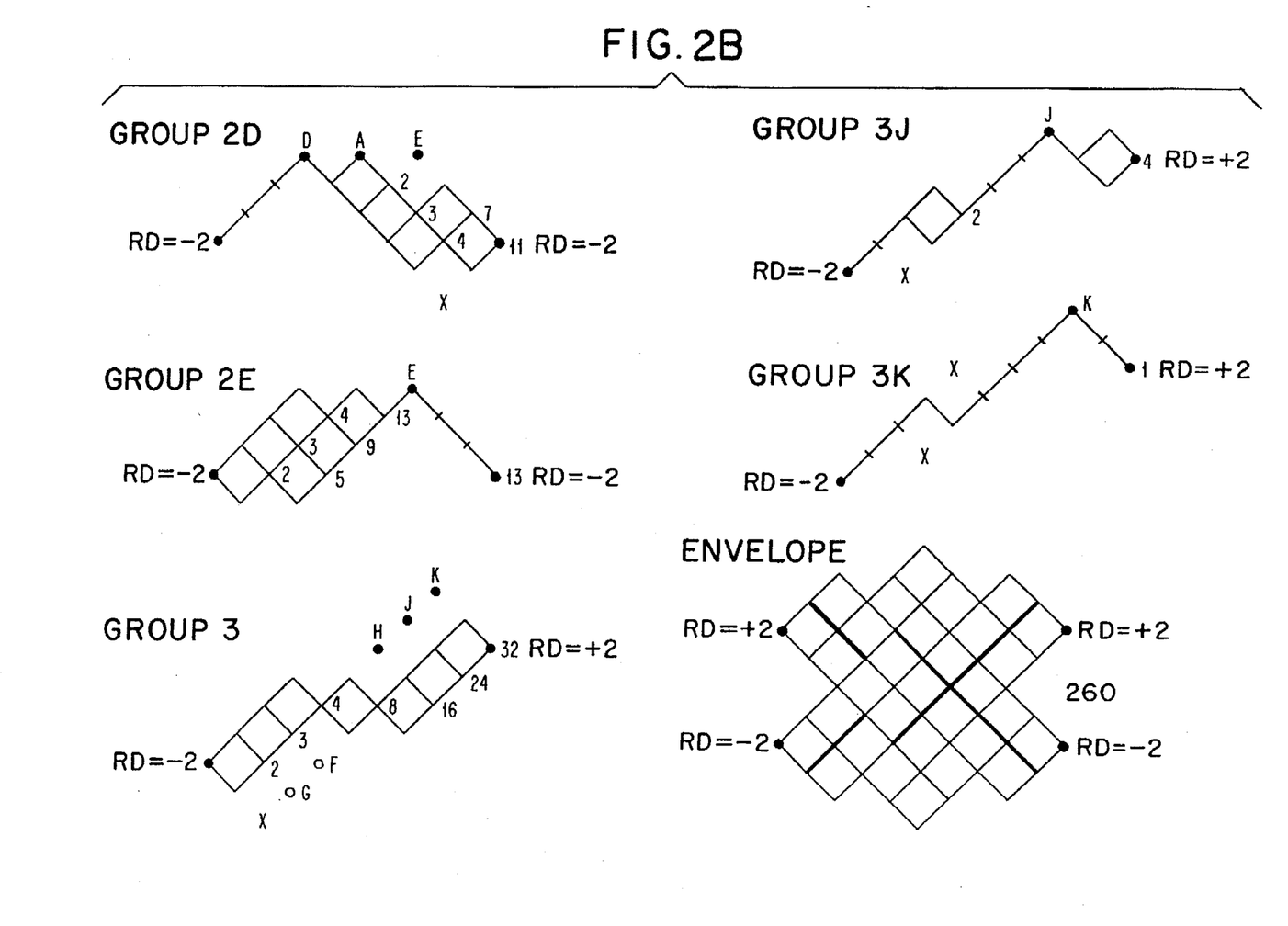

An 8B/10B Code with local Parity and a short Comma (FIG. 2)

For the 8B/10B transmission code described here, a built-in parity feature has been traded for increased low frequency content. Any 10B character of this code afflicted with an odd number of bit errors is an invalid character.

The code below according to the present invention translates 8 source bits to 10 coded bits in an arrangement better suitable for serial transmission. It uses vectors from the set of 252 balanced (zero disparity) 10-bit vectors and from the 120 complementary vector pairs with a disparity of ±4, which are inserted with alternating polarity. Thus, a single error in a character will generate a disparity of 2 or 6, which both are illegal combinations.

The Run Length (RL), which is the number of contiguous identical bits, is limited to 5, and adjacent runs of 5 are not allowed. The bit pattern '11011111' and its complement are a synchronizing sequence or comma. It is embedded in a comma character '0110111110' or its complement '1001000001'. Serial transmission starts from the left. The comma character contains 4 inside transitions, and a sequence of comma characters generates 5 transitions per character. Beside the comma character, there are 4 other special, non-data characters.

Alternatively, the bit sequence '11111011' and its complement can be chosen as a comma with compatible code vectors. The trellis diagrams below are then read from right to left rather than from left to right. The first bit of a transmitted code byte is then on the right hand side.

Figure 3:
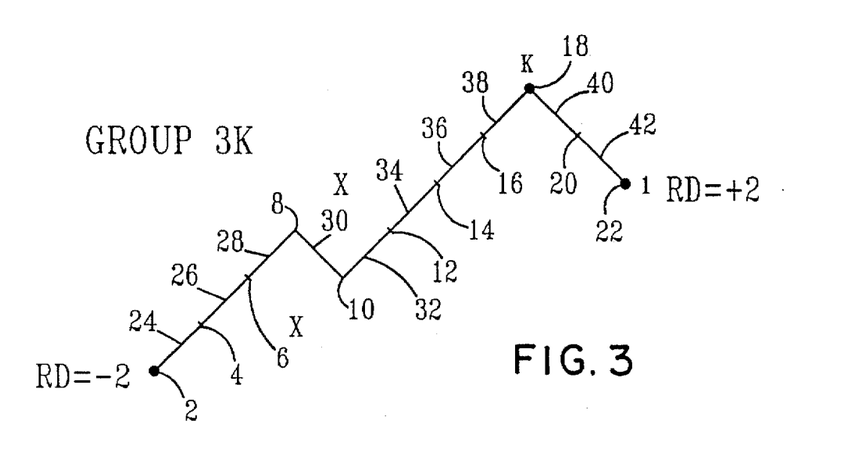
FIG. 3 shows an example of assigning "1s" and "0s" to the trellis diagram of FIG. 2 to determine the bit sequence of the code characters.

All the valid coded characters are represented in the trellis diagrams of FIG. 2, 'Trellis for 8B/10B Code with Local Parity', where each rising branch stands for a one bit, and each falling branch for a zero bit. For example, Group 3K of FIG. 2 which has one member, is reproduced in FIG. 3. FIG. 3 shows 11 nodes: 2, 4, 6, 8, 10, 12, 14, 16, 18, 20 and 22. The rising lines (or branches) 24, 26 and 28 represent 3 "ones". The following line or branch 30 between nodes 8 and 10 correspond to a zero. The rising branches 32, 34, 36 and 38 correspond to 4 "ones", The following branches 40 and 42 corresponds to 2 zeros. Therefore, the character of Group 3K is "1110111100". The numbers to the right of each node of FIG. 2 stand for the number of different valid paths to that node from the input node. The disparity of a block of bits (such as a byte or character) is the algebraic difference between the number of ones minus the number of zeros. The running disparity RD at a particular point in the serial bit stream is the sum of the disparity of the preceding blocks. The disparity of a block of bits is equal to the difference between the RD at the end of the block and the RD at the beginning of the block. The digital sum variation is the algebraic difference between the maximum and minimum values of the RD over a block. At the boundary between bytes, the running disparity RD for the present code, is always ±2. For 8B/10B codes without local parity, the RD at byte boundaries is usually ±1. For the code described here, we limit the starting and ending RL to two, except that the coded bytes are allowed to start with 3 ones from RD=−2 or 3 zeros from RD=+2; coded bytes may end with 3 zeros at RD=−2, and with 3 ones at RD=+2. The RL across character boundaries is thus limited to 5. The neighborhood of every possible RL of 5 is pruned so no misaligned comma sequences can arise. In FIG. 2, vectors passing through the isolated points marked x could all generate a false comma or a RL violation, including contiguous runs of 5.

The code comprises in the coded domain three major groups of vectors:

The 174 disparity independent, balanced vectors represented in Group 1 and 1A/B can be entered regardless of the starting disparity, as indicated by RD=±2 at the front. Because they are all balanced, the ending disparity is equal to the starting disparity.

The 27 balanced vectors of Group 2AC, 2D, and 2E are disparity dependent and can be entered only, if the starting RD is −2. For a positive starting RD, their complement is used.

The 59 vectors in Group 3, 3F, 3G, 3H, 3J, and 3K are unbalanced with a disparity of +4, and can be used only with negative starting RD as shown, otherwise their complements are used. The bold vector outlined in Group 3F is the comma.

The Envelope contains all the vectors needed for the coding of 260 characters for a starting disparity of either +2 or −2. Not all the vectors of the envelope are actually permitted, but only those listed in the separate groupings listed above, which define all the constraints. There is a correlation between low frequency spectral components of a code and the traces through the trellis envelope. Beside the coarse characterization by the maximum Digital Sum Variation (DSV), a normalized offset can be defined, which is a measure of the area between the zero disparity line and a vector trace. The smaller the maximum offset, the better is the low frequency behavior.

As seen from the envelope, the maximum DSV of this code is 10. It is possible to reduce the DSV to 8, but this entails contiguous runs of five. In this context, it is of interest that the upper and lower contours of the envelope do not represent valid characters. The only vectors through the highest and lowest point of the envelope are those of Group A/B. The outermost contours of the envelope are given by the outermost upper and lower contour of Group 1 or Group 1A/B. Starting with a disparity of +2, we can transmit 1101010100 or 1101100010, and in each case enclose an area between the contour and the zero disparity which amounts to 33 area units (disparity×time) per byte, or an average of 3.3 per bit interval, which we call the normalized offset. The complements of these same vectors starting with negative disparity follow the lower contour. Because the maximum offset for the vectors passing through the points with running disparity of ±5 (point A and B of Group 1A/B) is no greater than the outermost vector limited to a DSV of 8, the low frequency penalty for the DSV of 10 is not as severe as one would otherwise expect for a DSV of 10 with no such added constraint. Simulations show that for this code the low frequency cutoff of a single RC high pass filter must be set no higher than 0.055% of the bit rate, if the eye closure is to be kept to less than 0.25 dB. This is lower than for the FCS code (U.S. Pat. No. 4,486,739) by almost a factor of 2. For the variant of the code with a DSV of 8 but contiguous runs of 5, the low frequency cut-off can be moved up to 0.063% of the bit rate for an equal eye closure penalty. From FIG. 2, we can also easily see that the minimum transition density is 3 per character.

Implementation of the 8B/10B code with local parity

An implementation using full or partial tables is the easiest but probably the least economical approach, if the cost of the initial design effort is ignored. A design with reasonable complexity using just combinatorial logic can be achieved. Well over 200 vectors can be disposed off by using design principles similar to the FCS code: Change as few bits as possible and classify the vectors into groups to be handled by common hardware. For the last 30 or 40 vectors it becomes increasingly difficult to find commonalities, and to define groups with more than a few vectors. It is then mainly a question of when to resort to individual vector translation to complete the job. Because any implementation, other than by table lookup, is very dependent on the assignment of individual source bytes to a specific coded vector, we do not give a translation table. Any implementation with combinatorial logic will likely have at least two more levels of logic in the critical path, more gates, and generally larger fan-in numbers, when compared with the partitioned FCS code.

Evaluation of the local parity code

Applications which do not require error correction are penalized by more complex implementations for the coder and decoder. In some instances, a somewhat faster technology may be required. All the high pass filters in the serial signal path need time constants larger by a factor of two. Otherwise, the performance of the code could be expected to be comparable to the FCS code. From the current perspective, an adoption of this code might be advantageous for the following types of links:

Systems which always use forward error correction, not just as an option.

Systems using forward error correction in combinations with very short frames or high error rates, which force short error correction blocks. For such cases, the ability to operate with just 8 vertical parity bits per block would be an advantage.

As suggested by Martin [1985], a code with local parity could be exploited for maximum likelihood signal detection. For instance, if we use a single step offset in each direction from the perceived optimum sampling point for both time and amplitude, we could easily end up with 5 to 9 samples per bit or up to 90 samples per byte. For practical reasons, it is then important to recognize an erroneous byte right away, rather then at the end of the frame. Such a technique to reduce the error rate would also be preferable for real time and other delay sensitive systems.

Vertical Parity for Error Correction

An odd parity bit is derived for each column of the coded or uncoded matrix, and transmitted in coded form after the end of the frame. For easy implementation, it is preferred to derive the parity from the uncoded data, because of better compatibility with common data formats, buffer width, and the processing stream. Typically, one byte of vertical parity bits will be generated, but a larger or smaller segmentation is possible. At the receiving end, the decoder may enlarge a single bit error to a burst of 8 in the decoded domain. The matrix correction scheme is not adversely affected by this error spread.

For the code with local parity, a single bit transmission error will always generate an invalid byte. After the end of a frame has been received, each bit of the invalid byte in a column with a vertical parity violation is complemented. If more than one byte in a frame is invalid, no correction attempt is made.

Burst Errors

If link is afflicted with a significant number of burst errors spread over less than 10 coded bits, one would want to be able to correct errors which straddle byte boundaries. To this end, two vertical parity bytes are sent along, the first is computed on all even numbered bytes, and the second on all odd numbered bytes.

Recovery of Special Characters

The case of special characters which are afflicted with errors deserves extra scrutiny. For applications which use a variety of special characters in unpredictable configurations, an additional vertical parity bit is used for the K bit, which indicates whether a byte is data or control information. For the FCS application, this bit would be useful only to correct errors in the comma character of the Start and End of Frame delimiter which can be done by other means.

Start and End of Frame Detection

It is very important to correctly recognize the Start of Frame (SOF) and the End (EOF), otherwise the parity correction scheme does not work. At the transmitter, this is no problem, because of the absence of errors. Our goal is to recognize the frame boundaries at the receiver correctly, unless there are at least two bytes with errors. The companion application Ser. No. 08/332,327 filed Oct. 31, 1994 "Apparatus and Method for Error Correction Based on Transmission Code Violations and Parity" includes a detailed description on how to reliably detect the FCS Start and End of Frame delimiters. A similar methodology can be used with the local parity code of this application. Only some details are different because the coded words, including the comma character are different.

Conclusion

A code with local parity can locate an erroneous byte in a frame without extra parity bits, but such a code is more complex to implement and generates larger low frequency spectral components. This error locating techniques make error correction by simple vertical parity possible and is well suited for link architectures with short frames. It can be made transparent to transmission protocols above the link level.

| Tables of Coded Vectors for Transmission Code with Local Parity | | | | | |
|---|---|---|---|---|---|
| Group 1: 162 Balanced, disparity independent Vectors | | | | | |
| 11010 10100 | 11001 10100 | 10110 10100 | 10101 10100 | 10011 10100 | 01110 10100 |
| 11010 01100 | 11001 01100 | 10110 01100 | 10101 01100 | 10011 01100 | 01110 01100 |
| 11010 10010 | 11001 10010 | 10110 10010 | 10101 10010 | 10011 10010 | 01110 10010 |
| 11010 01010 | 11001 01010 | 10110 01010 | 10101 01010 | 10011 01010 | 01110 01010 |
| 11010 00110 | 11001 00110 | 10110 00110 | 10101 00110 | 10011 00110 | 01110 00110 |
| 11010 10001 | 11001 10001 | 10110 10001 | 10101 10001 | 10011 10001 | 01110 10001 |
| 11010 01001 | 11001 01001 | 10110 01001 | 10101 01001 | 10011 01001 | 01110 01001 |
| 11010 00101 | 11001 00101 | 10110 00101 | 10101 00101 | 10011 00101 | 01110 00101 |
| 11010 00011 | 11001 00011 | 10110 00011 | 10101 00011 | 10011 00011 | 01110 00011 |
| 01101 10100 | 01011 10100 | 00111 10100 | 00101 10100 | 10110 10100 | 01001 10100 |
| 01101 01100 | 01011 01100 | 00111 01100 | 00101 01100 | 10110 01100 | 01001 01100 |
| 01101 10010 | 01011 10010 | 00111 10010 | 00101 10010 | 10110 10010 | 01001 10010 |
| 01101 01010 | 01011 01010 | 00111 01010 | 00101 01010 | 10110 01010 | 01001 01010 |
| 01101 00110 | 01011 00110 | 00111 00110 | 00101 00110 | 10110 00110 | 01001 00110 |
| 01101 10001 | 01011 10001 | 00111 10001 | 00101 10001 | 10110 10001 | 01001 10001 |
| 01101 01001 | 01011 01001 | 00111 01001 | 00101 01001 | 10110 01001 | 01001 01001 |
| 01101 00101 | 01011 00101 | 00111 00101 | 00101 00101 | 10110 00101 | 01001 00101 |
| 01101 00011 | 01011 00011 | 00111 00011 | 00101 00011 | 10110 00011 | 01001 00011 |
| 01010 10100 | 01100 10100 | 10001 10100 | 10010 10100 | 10100 10100 | 11000 10100 |
| 01010 01100 | 01100 01100 | 10001 01100 | 10010 01100 | 10100 01100 | 11000 01100 |
| 01010 10010 | 01100 10010 | 10001 10010 | 10010 10010 | 10100 10010 | 11000 10010 |
| 01010 01010 | 01100 01010 | 10001 01010 | 10010 01010 | 10100 01010 | 11000 01010 |
| 01010 00110 | 01100 00110 | 10001 00110 | 10010 00110 | 10100 00110 | 11000 00110 |
| 01010 10001 | 01100 10001 | 10001 10001 | 10010 10001 | 10100 10001 | 11000 10001 |
| 01010 01001 | 01100 01001 | 10001 01001 | 10010 01001 | 10100 01001 | 11000 01001 |
| 01010 00101 | 01100 00101 | 10001 00101 | 10010 00101 | 10100 00101 | 11000 00101 |
| 01010 00011 | 01100 00011 | 10001 00011 | 10010 00011 | 10100 00011 | 11000 00011 |

| Group 1A/B: 12 Balanced, disparity independent Vectors | | | |
|---|---|---|---|
| 11011 00010 | 11011 00001 | 00100 11101 | 00100 11110 |
| 10111 00010 | 10111 00001 | 01000 11101 | 01000 11110 |
| 01111 00010 | 01111 00001 | 10000 11101 | 10000 11110 |

Group 2A/C: 3 Balanced, disparity dependent Vectors
for negative starting disparity
Complement Vectors for positive starting disparity not shown 11011 00100
10111 00100
01111 00100

Group 2D: 11 Balanced, disparity dependent Vectors
for negative starting disparity
Complement Vectors for positive starting disparity not shown

| 11101 00100 | 11100 10100 | 11100 01100 | 11100 00110 |
|---|---|---|---|
| 11101 00010 | 11100 10010 | 11100 01010 | 11100 00101 |
| 11101 00001 | 11100 10001 | 11100 01001 | |

-continued

Tables of Coded Vectors for Transmission Code with Local Parity

Group 2E: 13 Balanced, disparity dependent Vectors
for negative starting disparity
Complement Vectors for positive starting disparity not shown

| | | |
|---|---|---|
| 11101 01000 | 11100 11000 | 11001 11000 |
| 11011 01000 | 11010 11000 | 10101 11000 |
| 10111 01000 | 10110 11000 | 10011 11000 |
| 10111 01000 | 01110 11000 | 01101 11000 |
| | | 01011 11000 |

Group 3: 32 Vectors with Dispatity of +4
for negative starting disparity
Complement Vectors (D = 031 4) for positive starting disparity not shown

| | | | |
|---|---|---|---|
| 11101 01110 | 10111 01110 | 11100 11110 | 10110 11110 |
| 11101 01101 | 10111 01101 | 11100 11101 | 10110 11101 |
| 11101 01011 | 10111 01011 | 11100 11011 | 10110 11011 |
| 11101 00111 | 10111 00111 | 11100 10111 | 10110 10111 |
| 11011 01110 | 01111 01110 | 11010 11110 | 01110 11110 |
| 11011 01101 | 01111 01101 | 11010 11101 | 01110 11101 |
| 11011 01011 | 01111 01011 | 11010 11011 | 01110 11011 |
| 11011 00111 | 01111 00111 | 11010 10111 | 01110 10111 |

Group 3F: 9 Vectors with Disparity of +4
for negative starting disparity
Complement Vectors (D = −4) for positive starting disparity not shown

| | | |
|---|---|---|
| 11001 11110 | 10101 11110 | 01101 11110 |
| 11001 11101 | 10101 11101 | 01101 11101 |
| 11001 11011 | 10101 11011 | 01101 11011 |

Group 3G: 4 Vectors with Disparity of +4
for negative starting disparity
Complement Vectors (D = −4) for positive starting disparity not shown

| | |
|---|---|
| 10011 11101 | 01011 11101 |
| 10011 11011 | 01011 11011 |

Group 3H: 9 Vectors with Disparity of +4
for negative starting disparity
Complement Vectors (D = −4) for positive starting disparity not shown

| | | |
|---|---|---|
| 11101 10110 | 11011 10110 | 10111 10110 |
| 11101 10101 | 11011 10101 | 10111 10101 |
| 11101 10011 | 11011 10011 | 10111 10011 |

Group 3J: 4 Vectors with Disparity of +4
for negative starting disparity
Complement Vectors (D = −4) for positive starting disparity not shown

| | |
|---|---|
| 11101 11010 | 11011 11010 |
| 11101 11001 | 11011 11001 |

Group 3K: 1 Vector with Disparity of +4
for negative starting disparity
Complement Vector (D = −4) for positive starting disparity not shown 11101 11100

References

Martin W. Sachs. High Performance Networks, Technology and Protocols, Chapter II.5, Fibre Channel. Ahmed N. Tantawy, Editor. Kluwer Academic Publishers, Boston, 1994.

X3T9 Technical Committee. Fibre Channel, Physical and Signaling Interface (FC-PH); Rev. 3.0. FC-P/92-001R3.0. American National Standards Institute, 1430 Broadway, New York, N.Y. 10018, 1992. Available from: Global Engineering, 2805 McGaw St., Irvine, Calif. 92714

Wayne D. Grover. Forward Error Correction in Dispersion-Limited Lightwave Systems. IEEE Journal of Lightwave Technology, 6(5):643–654, May 1988.

C. Benz, M. Gowan and K. Springer. An Error Correcting Encoder and Decoder for a 1 Gbit/s Fiber Optic Link. Proc. IEEE 1991 Custom Integrated Circuits Conference, 7.1.1–7.1.4, San Diego, May 1991.

D. H. McMahon, A. A. Kirby, B. A. Schofield and K. Springer. U.S. Pat. No. 5,144,304. Data and Forward Error Control Coding Techniques for Digital Signals. Sept. 1, 1992.

K. Springer. A Forward Error Correcting Code for Gigabit Fiber Optic Links. Conference on High-Speed Fiber Networks and Channels (1991), Boston. September 1991. Proc. SPIE—Int. Soc. Opt. Eng. (USA), Vol. 1577, 1992, pp 246–253.

C. A. French. Distance Preserving Run-Length Limited Codes. IEEE Transactions on Magnetics, MAC-25(5):4093–4095, September 1989.

M. Blaum. Combining ECC with modulation: performance comparisons. IEEE Transactions on Information Theory, 37(3):945–949, May 1991.

M. Blaum, S. Litsyn, V. Buskens and C. A. van Tilborg. Error-Correcting Codes with Bounded Running Digital Sum. IEEE Transactions on Information Theory. 39(1):216–227, January 1993.

C. S. Coetzee, H. C. Ferreira and P. G. W. van Rooyen. On the Performance and Implementation of a Class of Error and Erasure Control (d,k) Block Codes. IEEE Transactions on Magnetics, 26(5):2312–2314, September 1990.

R. W. Hamming. Coding and Information Theory, 2nd Ed. Prentice Hall Inc., Englewood Cliffs, N.J. 07632, 1986.

G. N. N. Martin. A Rate 8/10 DC Balanced Code with Local Parity. IBM Technical Disclosure Bulletin, 27(9):5272–5279, February 1985.

A. X. Widmer and P. A. Franaszek. A DC-Balanced, Partitioned-Block, 8B/10B Transmission Code. IBM Journal of Research and Development, Vol. 27, No. 5, pp. 440–451, September 1983.

I claim:

1. An apparatus for coding a frame of N-bit into a frame of M-bit bytes wherein M>N>0, and wherein said frame has a boundary and wherein there is a byte boundary between said bytes comprising:

means for storing said frame of N-bit bytes;

means for providing a code containing members of M-bit bytes which is a subset of all possible M-bit bytes, for each of the $2^N$ possible N-bit bytes there is a corresponding member in said subset, each of said members of said code has a sequence of bits, such that if a state of one of said bits is changes, a resulting M-bit byte is not one of said members of said code; one of said members of said code is a comma used to identify said frame boundary and said byte boundary, said comma has a sequence of bits having a binary state selected from a first and second value such that said bit sequence of said comma is confined to said one of said members of said code and said bit sequence of said comma does not occur across a boundary between any combination of any other members of said code;

means for assigning to each of said N-bit bytes in said frame said corresponding member from said code to form a coded frame corresponding to said frame;

means for storing said coded frame;

wherein N=8 and M=10, and wherein said code is a 10-bit code and wherein said code includes 10-bit bytes all of which have a digital sum variation of zero, +four, or –four.

2. An apparatus according to claim 1, further including a means for transmitting said coded frame to a receiving apparatus as a transmitted coded frame.

3. An apparatus according to claim 2, wherein said receiving apparatus has a means for determining if said transmitted coded frame has an error.

4. An apparatus according to claim 3, further including a means for correcting said error.

5. An apparatus according to claim 3, further including a means for determining a bit location of said error.

6. An apparatus according to claim 5, wherein said means for storing said frame is a memory and said means for storing said coded frame is a memory.

7. An apparatus according to claim 1, wherein said comma contains a bit pattern selected from the group consisting of '11011111' and its complement '00100000'.

8. An apparatus according to claim 1, wherein said comma is embedded in '0110111110' and its complement '1001000001'.

9. An apparatus according to claim 1, wherein said code only permits run lengths of a binary state of less than or equal to 5.

10. An apparatus according to claim 9, wherein said members of said code have a start and an end with a run length of one or two; a run of three at said start of a member is allowed only if the running disparity moves toward balance for the first 2 bits of the run; a run of three at the said end of a member is allowed only is the running disparity moves away from balance for the last 2 bits of the run.

11. An apparatus according to claim 10, wherein said run length at said starting boundary of some of said members is 3 "1's" if the running disparity at said start is –2 and 3 "0's" if the running disparity is +2 at said start.

12. An apparatus according to claim 10, wherein said run length at said end of some of said members is 3 zeros if the running disparity at said end is –2, and three ones if the running disparity is +2 at said end.

13. An apparatus according to claim 1, wherein said code includes 174 10-bit bytes which are balanced and disparity independent, 27 pairs of balanced and disparity dependent 10-bit byes, and 59 pairs of 10 bit bytes having disparity of ±4 and which are disparity dependent.

14. An apparatus according to claim 1, wherein said means for storing said frame of N-bit bytes is a memory and wherein said means for storing said coded frame is a memory.

15. An apparatus according to claim 1, wherein said comma contains a bit pattern selected from the group consisting of '11111011' and its complement '00000100'.

16. An apparatus according to claim 1, wherein said comma is embedded in '0111110110' and its complement '1000001001'.

17. A machine having a memory which contains coded data in the form of M-bit bytes representing the uncoded data in the form of N-bit bytes, wherein M ;f.gt N>0, generated by the method comprising the steps of:

providing uncoded data in the form of N-bit bytes;

generating said coded data by providing a code containing members of M-bit bytes which is a subset of all possible M-bit bytes; for each of the $2^N$ possible N-bit bytes there is a corresponding member in said subset; each of said members of said code has a sequence of bits having a binary state selected from one of three values such that is said state of one of said bits is changed, a resulting M-bit byte is not one of said members of said code; one of said members of said code is a comma used to identify said frame boundary; said comma has a sequence of bits having a binary state selected from a first and second value such that said bit sequence of said comma is confined to said one of said members of said code and said bit sequence of said comma does not occur across a boundary between any combination of any other members of said code;

assigning to each of said N-bit bytes in said uncoded data said corresponding member from said code to generate said coded data corresponding to said uncoded data;

wherein N=8 and M=10, and wherein said code is a 10-bit code and wherein said code includes 10-bit bytes all of which have a digital sum variation of zero, +four, or –four.

18. A method for coding a frame of N-bit bytes into a frame of coded M-bit bytes wherein M>N>0 and wherein said frame has a frame boundary and wherein there is a byte boundary between said bytes, comprising the steps of:

storing said frame of N-bit bytes;

providing a code containing members of M-bit bytes which is a subset of all possible M-bit bytes; for each of the $2^N$ possible N-bit bytes there is a corresponding member in said subset, each of said members of said code has a sequence of bits such that if a state of one of said bits is changed, a resulting M-bit byte is not one of said members of said code; one of said members of said code is a comma used to identify said frame boundary and said byte boundary, said comma has a sequence of bits having a binary state selected from a first and second value such that said bit sequence of said comma is confined to said one of said members of said code and said bit sequence of said comma does not occur across a boundary between any combination of any other members of said code;

assigning to each of said N-bit bytes in said frame said corresponding member from said code to form a coded frame corresponding to said frame; and means for storing said coded frame;

wherein N=8 and M=10, and wherein said code is a 10-bit code and wherein said code includes all 10-bit bytes having a digital sum variation of 4 or less and a run length limit of 2 at each end.

19. A method according to claim 18, further including the steps of transmitting said coded frame to a receiving apparatus as a transmitted coded frame.

20. A method according to claim 19, further including correcting said error.

21. A method according to claim 20, wherein said comma contains a bit pattern selected from the group consisting of '11011111' and its complement '00100000'.

22. A method according to claim 20, wherein said comma is selected from the group consisting of '0110111110' and its complement '1001000001'.

23. A method according to claim 22, wherein said members of said code have a start and an end with a run length of one or two; a run of three at said start of a member is allowed only if the running disparity moves toward balance for the first 2 bits of the run; a run of three at the said end of a member is allowed only is the running disparity moves away from balance for the last 2 bits of the run.

24. A method according to claim 23, wherein said run length at said starting boundary of some of said members is 3 "1's" if the running disparity at said start is –2, and 3 "0's" if the running disparity is +2 at said start.

25. A method according to claim 23, wherein said run length at said end of some of said members is 3 zeros if the running disparity at said end is –2, and three ones if the running disparity is +2 at said end.

26. A method according to claim 21, wherein said code only permits run lengths of a binary state of less than or equal to 5.

27. A method according to claim 20, wherein said code includes 174 10-bit bytes which are balanced and disparity independent, 27 pairs of balanced and disparity dependent 10-bit byes, and 59 complementary pairs of 10 bit bytes having disparity of ±4 and which are disparity dependent.

28. A method according to claim 19, further including the step of determining a bit location for said error.

29. A method according to claim 18, wherein said receiving apparatus determines if said transmitted coded frame has an error.

30. A method according to claim 18, wherein said step of storing said frame of N-bit bytes is storing in a memory and wherein said step of storing said coded frame is storing in a memory.

31. A method according to claim 30, wherein said step of storing said frame stores said frame in a memory and said means for storing said code frame stores said coded frame in a memory.

32. An apparatus for producing a run length limited 8B/10B code for an unconstrained input data stream comprising:

a means for storing a frame of a plurality of 8 bit bytes;

a means for allocating to each of said 8-bit bytes a coded 10-bit byte to form a coded frame;

a means for storing said coded frame;

said set of coded 10-bit bytes comprises:

a set of 162 balanced disparity independent coded bytes having digital sum variations of 4 or less having form:

| | | | | | | |
|---|---|---|---|---|---|---|
| 11001 10100 | 11001 10100 | 10110 10100 | 10101 10100 | 10011 10100 | 01110 10100 | |
| 11001 01100 | 11001 01100 | 10110 01100 | 10101 01100 | 10011 01100 | 01110 01100 | |
| 11001 10010 | 11001 10010 | 10110 10010 | 10101 10010 | 10011 10010 | 01110 10010 | |
| 11001 01010 | 11001 01010 | 10110 01010 | 10101 01010 | 10011 01010 | 01110 01010 | |
| 11001 00110 | 11001 00110 | 10110 00110 | 10101 00110 | 10011 00110 | 01110 00110 | |
| 11001 10001 | 11001 10001 | 10110 10001 | 10101 10001 | 10011 10001 | 01110 10001 | |
| 11001 01001 | 11001 01001 | 10110 01001 | 10101 01001 | 10011 01001 | 01110 01001 | |
| 11001 00101 | 11001 00101 | 10110 00101 | 10101 00101 | 10011 00101 | 01110 00101 | |
| 11001 00011 | 11001 00011 | 10110 00011 | 10101 00011 | 10011 00011 | 01110 00011 | |
| | | | | | | |
| 01101 10100 | 01011 10100 | 00111 10100 | 00101 01011 | 00110 01011 | 01001 01011 | |
| 01101 01100 | 01011 01100 | 00111 01100 | 00101 10011 | 00110 10011 | 01001 10011 | |
| 01101 10010 | 01011 10010 | 00111 10010 | 00101 01101 | 00110 01101 | 01001 01101 | |
| 01101 01010 | 01011 01010 | 00111 01010 | 00101 10101 | 00110 10101 | 01001 10101 | |
| 01101 00110 | 01011 00110 | 00111 00110 | 00101 11001 | 00110 11001 | 01001 11001 | |
| 01101 10001 | 01011 10001 | 00111 10001 | 00101 01110 | 00110 01110 | 01001 01110 | |
| 01101 01001 | 01011 01001 | 00111 01001 | 00101 10110 | 00110 10110 | 01001 10110 | |
| 01101 00101 | 01011 00101 | 00111 00101 | 00101 11010 | 00110 11010 | 01001 11010 | |
| 01101 00011 | 01011 00011 | 00111 00011 | 00101 11100 | 00110 11100 | 01001 11100 | |
| | | | | | | |
| 01010 01011 | 01100 01011 | 10001 01011 | 10010 01011 | 10100 01011 | 11000 01011 | |
| 01010 10011 | 01100 10011 | 10001 10011 | 10010 10011 | 10100 10011 | 11000 10011 | |
| 01010 01101 | 01100 01101 | 10001 01101 | 10010 01101 | 10100 01101 | 11000 01101 | |
| 01010 10101 | 01100 10101 | 10001 10101 | 10010 10101 | 10100 10101 | 11000 10101 | |
| 01010 11001 | 01100 11001 | 10001 11001 | 10010 11001 | 10100 11001 | 11000 11001 | |
| 01010 01110 | 01100 01110 | 10001 01110 | 10010 01110 | 10100 01110 | 11000 01110 | |
| 01010 10110 | 01100 10110 | 10001 10110 | 10010 10110 | 10100 10110 | 11000 10110 | |
| 01010 11010 | 01100 11010 | 10001 11010 | 10010 11010 | 10100 11010 | 11000 11010 | |
| 01010 11100 | 01100 11100 | 10001 11100 | 10010 11100 | 10100 11100 | 11000 11100 | | a set of 12 balanced disparity independent coded bytes, having a digital sum variation of 6 for the set having form:

| | | | |
|---|---|---|---|
| 11011 00010 | 11011 00001 | 00100 11101 | 00100 11110 |
| 10111 00010 | 10111 00001 | 01000 11101 | 01000 11110 |
| 01111 00010 | 01111 00001 | 10000 11101 | 10000 11110 | a set of 3 balanced disparity dependent 10-bit bytes which is used for a starting running disparity of −2, and for which the complement is used for a starting running disparity of +2: having form:

| |
|---|
| 11011 00100 |
| 10111 00100 |
| 01111 00100 | a set of 11 balanced disparity independent 10-bit bytes which is used for a starting running disparity of −2, and for which the complement is used for a starting running disparity of +2 having form:

| | | | |
|---|---|---|---|
| 11101 00100 | 11100 10100 | 11100 01100 | 11100 00110 |
| 11101 00010 | 11100 10010 | 11100 01010 | 11100 00101 |
| 11101 00001 | 11100 10001 | 11100 01001 | | a set of 13 balanced disparity dependent 10-bit bytes which is used for a starting running disparity of −2, and for which the complement is used for a starting running disparity of +2 having form:

| | | |
|---|---|---|
| 11101 01000 | 11100 11000 | 11001 11000 |
| 11011 01000 | 11010 11000 | 10101 11000 |
| 10111 01000 | 10110 11000 | 10011 11000 |
| 01111 01000 | 01110 11000 | 01101 11000 |
| | | 01011 11000 | a set of 32 unbalanced disparity dependent 10-bit bytes with a disparity of +4 which is used for a starting running disparity of −2, and for which the complement is used for a starting running disparity of +2 having form:

| | | | |
|---|---|---|---|
| 11101 01110 | 10111 01110 | 11100 11110 | 10110 11110 |
| 11101 01101 | 10111 01101 | 11100 11101 | 10110 11101 |
| 11101 01011 | 10111 01011 | 11100 11011 | 10110 11011 |
| 11101 00111 | 10111 00111 | 11100 10111 | 10110 10111 |
| 11011 01110 | 01111 01110 | 11010 11110 | 01110 11110 |
| 11011 01101 | 01111 01101 | 11010 11101 | 01110 11101 |
| 11011 01011 | 01111 01011 | 11010 11011 | 01110 11011 |
| 11011 00111 | 01111 00111 | 11010 10111 | 01110 10111 | a set of 9 unbalanced disparity dependent 10-bit bytes with a disparity of +4 which is used for a starting running disparity of −2, and for which the complement is used for a starting running disparity of +2 having form wherein the coded byte 01101 11110 represent the comma

| | | |
|---|---|---|
| 11001 11110 | 10101 11110 | 01101 11110 |
| 11001 11101 | 10101 11101 | 01101 11101 |
| 11001 11011 | 10101 11011 | 01101 11011 | a set of 4 unbalanced disparity dependent 10-bit bytes with a disparity of +4 which is used for a starting running disparity of −2, and for which the complement is used for a starting running disparity of +2 having form:

| | |
|---|---|
| 10011 11101 | 01011 11101 |
| 10011 11011 | 01011 11011 | a set of 9 unbalanced disparity dependent 10-bit bytes with a disparity of +4 which is used for a starting running disparity of −2, and for which the complement is used for a starting running disparity of +2 having form:

| | | |
|---|---|---|
| 11101 10110 | 11011 10110 | 10111 10110 |
| 11101 10101 | 11011 10101 | 10111 10101 |
| 11101 10011 | 11011 10011 | 10111 10011 | a set of 5 unbalanced disparity dependent 10-bit bytes with a disparity of +4 which is used for a starting running disparity of −2, and for which the complement is used for a starting running disparity of +2 having form:

| | |
|---|---|
| 11101 11010 | 11011 11010 |
| 11101 11001 | 11011 11001 |

1 unbalanced disparity dependent 10-bit byte with a disparity of +4 which is used for a starting running disparity of −2, and for which the complement is used for a starting running disparity of +2 having form:

| |
|---|
| 11101 11100. |

33. An apparatus according to claim 32 which uses sets of coded words which are the left/right symmetrical images of the code tables shown.

34. A method for producing a run length limited 8B/10B code for an unconstrained input data sequence comprising:

providing in a first memory location a frame of a plurality of 8 bit bytes;

allocating to each of said 8-bit bytes a corresponding 10-bit byte;

storing in a second memory location said corresponding coded 10-bit bytes as a coded frame;

said frame of coded 10-bit bytes comprises:

a set of 162 balanced disparity independent coded bytes having digital sum variation of 4 or less, wherein each rising branch represents a "1" and each falling branch represents a "0" having form:

| | | | | | |
|---|---|---|---|---|---|
| 11010 10100 | 11001 10100 | 10110 10100 | 10101 10100 | 10011 10100 | 01110 10100 |
| 11010 01100 | 11001 01100 | 10110 01100 | 10101 01100 | 10011 01100 | 01110 01100 |
| 11010 10010 | 11001 10010 | 10110 10010 | 10101 10010 | 10011 10010 | 01110 10010 |
| 11010 01010 | 11001 01010 | 10110 01010 | 10101 01010 | 10011 01010 | 01110 01010 |
| 11010 00110 | 11001 00110 | 10110 00110 | 10101 00110 | 10011 00110 | 01110 00110 |
| 11010 10001 | 11001 10001 | 10110 10001 | 10101 10001 | 10011 10001 | 01110 10001 |
| 11010 01001 | 11001 01001 | 10110 01001 | 10101 01001 | 10011 01001 | 01110 01001 |
| 11010 00101 | 11001 00101 | 10110 00101 | 10101 00101 | 10011 00101 | 01110 00101 |
| 11010 00011 | 11001 00011 | 10110 00011 | 10101 00011 | 10011 00011 | 01110 00011 |
| | | | | | |
| 01101 10100 | 01011 10100 | 00111 10100 | 00101 01011 | 00110 01011 | 01001 01011 |
| 01101 01100 | 01011 01100 | 00111 01100 | 00101 10011 | 00110 10011 | 01001 10011 |
| 01101 10010 | 01011 10010 | 00111 10010 | 00101 01101 | 00110 01101 | 01001 01101 |
| 01101 01010 | 01011 01010 | 00111 01010 | 00101 10101 | 00110 10101 | 01001 10101 |
| 01101 00110 | 01011 00110 | 00111 00110 | 00101 11001 | 00110 11001 | 01001 11001 |
| 01101 10001 | 01011 10001 | 00111 10001 | 00101 01110 | 00110 01110 | 01001 01110 |
| 01101 01001 | 01011 01001 | 00111 01001 | 00101 10110 | 00110 10110 | 01001 10110 |
| 01101 00101 | 01011 00101 | 00111 00101 | 00101 11010 | 00110 11010 | 01001 11010 |
| 01101 00011 | 01011 00011 | 00111 00011 | 00101 11100 | 00110 11100 | 01001 11100 |
| | | | | | |
| 01010 01011 | 01100 01011 | 10001 01011 | 10010 01011 | 10100 01011 | 11000 01011 |
| 01010 10011 | 01100 10011 | 10001 10011 | 10010 10011 | 10100 10011 | 11000 10011 |
| 01010 01101 | 01100 01101 | 10001 01101 | 10010 01101 | 10100 01101 | 11000 01101 |
| 01010 10101 | 01100 10101 | 10001 10101 | 10010 10101 | 10100 10101 | 11000 10101 |
| 01010 11001 | 01100 11001 | 10001 11001 | 10010 11001 | 10100 11001 | 11000 11001 |
| 01010 01110 | 01100 01110 | 10001 01110 | 10010 01110 | 10100 01110 | 11000 01110 |
| 01010 10110 | 01100 10110 | 10001 10110 | 10010 10110 | 10100 10110 | 11000 10110 |
| 01010 11010 | 01100 11010 | 10001 11010 | 10010 11010 | 10100 11010 | 11000 11010 |
| 01010 11100 | 01100 11100 | 10001 11100 | 10010 11100 | 10100 11100 | 11000 11100 | a set of 12 balanced disparity independent coded bytes having a digital sum variation of 6 for the set having form:

| | | | |
|---|---|---|---|
| 11011 00010 | 11011 00001 | 00100 11101 | 00100 11110 |
| 10111 00010 | 10111 00001 | 01000 11101 | 01000 11110 |
| 01111 00010 | 01111 00001 | 10000 11101 | 10000 11110 | a set of 3 balanced disparity dependent 10-bit bytes which is used for a starting running disparity of −2, and for which the complement is used for a starting running disparity of +2 having form:

| |
|---|
| 11011 00100 |
| 10111 00100 |
| 01111 00100 | a set of 11 balanced disparity dependent 10-bit bytes which is used for a starting running disparity of −2, and for which the complement is used for a starting running disparity of +2 having form:

| | | | |
|---|---|---|---|
| 11101 00100 | 11100 10100 | 11100 01100 | 11100 00110 |
| 11101 00010 | 11100 10010 | 11100 01010 | 11100 00101 |
| 11101 00001 | 11100 10001 | 11100 01001 | | a set of 13 balanced disparity dependent 10-bit bytes which is used for a starting running disparity of −2, and for which the complement is used for a starting running disparity of +2 having form:

| | | |
|---|---|---|
| 11101 01000 | 11100 11000 | 11001 11000 |
| 11011 01000 | 11010 11000 | 10101 11000 |
| 10111 01000 | 10110 11000 | 10011 11000 |
| 01111 01000 | 01110 11000 | 01101 11000 |
| | | 01011 11000 | a set of 32 unbalanced disparity dependent 10-bit bytes with a disparity of +4 which is used for a starting running disparity of −2, and for which the complement is used for a starting running disparity of +2 having form:

| | | | |
|---|---|---|---|
| 11101 01110 | 10111 01110 | 11100 11110 | 10110 11110 |
| 11101 01101 | 10111 01101 | 11100 11101 | 10110 11101 |
| 11101 01011 | 10111 01011 | 11100 11011 | 10110 11011 |
| 11101 00111 | 10111 00111 | 11100 10111 | 10110 10111 |
| 11011 01110 | 01111 01110 | 11010 11110 | 01110 11110 |
| 11011 01101 | 01111 01101 | 11010 11101 | 01110 11101 |
| 11011 01011 | 01111 01011 | 11010 11011 | 01110 11011 |
| 11011 00111 | 01111 00111 | 11010 10111 | 01110 10111 | a set of 9 unbalanced disparity dependent 10-bit bytes with a disparity of +4, which is used for a starting running disparity of −2, and for which the complement is used for a starting running disparity of +2 having form wherein the comma is the byte 01101 11110:

| | | |
|---|---|---|
| 11001 11110 | 10101 11110 | 01101 11110 |
| 11001 11101 | 10101 11101 | 01101 11101 |
| 11001 11011 | 10101 11011 | 01101 11011 | a set of 5 unbalanced disparity dependent 10-bit bytes with a disparity of +4 which is used for a starting running disparity of −2, and for which the complement is used for a starting running disparity of +2 having form:

| | |
|---|---|
| 10011 11101 | 01011 11101 |
| 10011 11011 | 01011 11011 | a set of 9 unbalanced disparity dependent 10-bit bytes with a disparity of +4 which is used for a starting running disparity of −2, and for which the complement is used for a starting running disparity of +2 having form:

| | | |
|---|---|---|
| 11101 10110 | 11011 10110 | 10111 10110 |
| 11101 10101 | 11011 10101 | 10111 10101 |
| 11101 10011 | 11011 10011 | 10111 10011 | a set of 4 unbalanced disparity dependent 10-bit bytes with a disparity of +4 which is used for a starting running disparity of −2, and for which the complement is used for a starting running disparity of +2 having form:

| | |
|---|---|
| 11101 11010 | 11011 11010 |
| 11101 11001 | 11011 11001 |

1 unbalanced disparity dependent 10-bit byte with a disparity of +4 which is used for a starting running disparity of −2, and for which the complement is used for a starting running disparity of +2 having form:

| |
|---|
| 11101 11100. |

35. An apparatus according to claim 34 which uses sets of coded bytes which are the left/right symmetrical images of the trellis diagrams shown, that is the first bit of byte is at the right side of the diagrams shown and the last bit is at the left side.

* * * * *